United States Patent [19]
Lepejian et al.

[11] Patent Number: 6,011,748
[45] Date of Patent: *Jan. 4, 2000

[54] METHOD AND APPARATUS FOR BUILT-IN SELF TEST OF INTEGRATED CIRCUITS PROVIDING FOR SEPARATE ROW AND COLUMN ADDRESSES

[75] Inventors: Yervant David Lepejian, Palo Alto, Calif.; Hovhannes Ghukasyan, Yerevan, Armenia; Lawrence Kraus, San Jose, Calif.

[73] Assignee: Credence Systems Corporation, Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/917,013

[22] Filed: Aug. 21, 1997

Related U.S. Application Data

[60] Provisional application No. 60/028,059, Oct. 3, 1996, and provisional application No. 60/028,060, Oct. 3, 1996.

[51] Int. Cl.[7] ..................................................... G11C 7/00
[52] U.S. Cl. ............... 365/233; 365/189.07; 365/230.03; 365/230.09; 365/239
[58] Field of Search ............................... 365/201, 230.03, 365/195, 189.07, 191, 233, 230.09, 239

[56] References Cited

U.S. PATENT DOCUMENTS

| | | | |
|---|---|---|---|
| 4,486,860 | 12/1984 | Takemae et al. | 365/230.03 X |
| 4,817,093 | 3/1989 | Jacobs et al. | 371/25 |
| 4,873,669 | 10/1989 | Furutani et al. | 365/201 X |
| 5,138,619 | 8/1992 | Fasang et al. | 371/21.1 |
| 5,258,986 | 11/1993 | Zerbe | 371/21.1 |
| 5,535,164 | 7/1996 | Adams et al. | 365/201 |
| 5,604,710 | 2/1997 | Tomishima et al. | 365/201 X |
| 5,615,159 | 3/1997 | Roohparvar | 365/201 |
| 5,617,531 | 4/1997 | Crouch et al. | 395/183.06 |
| 5,666,317 | 9/1997 | Tanida et al. | 365/201 |
| 5,689,466 | 11/1997 | Qureshi | 365/201 |
| 5,805,789 | 9/1998 | Huott et al. | 395/182.05 |
| 5,930,814 | 7/1999 | Lepejian et al. | 711/1 |

*Primary Examiner*—Do Hyun Yoo
*Attorney, Agent, or Firm*—Smith-Hill and Bedell

[57] ABSTRACT

A BIST function is provided in which both the row address and the column address of a memory to be tested may be selected independently. The present invention provides flexibility in selecting addresses to be tested, improves transition time between rows, and allows determination of which memory address passes or fails the test.

10 Claims, 4 Drawing Sheets

METHOD AND APPARATUS FOR BUILT-IN SELF TEST OF INTEGRATED CIRCUITS PROVIDING FOR SEPARATE ROW AND COLUMN ADDRESSES

CROSS-REFERENCE TO RELATED APPLICATIONS

This application claims the benefit of U.S. provisional application Ser. Nos. 60/028,059, filed Oct. 3, 1996, and 60/028,060, filed Oct. 3, 1996, the disclosure of which is incorporated by reference.

This application claims priority from the following U.S. Provisional Applications, the disclosures of which, including all appendices and all attached documents, are incorporated by reference in their entirety for all purposes:

Application Ser. No. 60/028,059, filed Oct. 3, 1996; and

Application Ser. No. 60/028,060, filed Oct. 3, 1996.

The following commonly-owned copending U.S. application is being filed concurrently and is hereby incorporated by reference in its entirety for all purposes:

U.S. patent application Ser. No. 08/918,521 filed Aug. 21, 1997 by Yervant David Lepejian, et. al. entitled, "Automatic Generation of User Definable Memory BIST Circuitry,".

BACKGROUND OF THE INVENTION

The present invention relates to semiconductor integrated circuits and, more particularly, to test circuits built into the integrated circuits (ICs) that enable efficient testing of embedded memory, especially read/write memory.

As integrated circuits achieve higher and higher levels of integration it is common to find several memory blocks of differing sizes embedded within blocks of logic in the integrated circuit. A typical example of embedded memory is the data and instruction cache memories along with their associated tag and valid data cache memories that are embedded in most modern microprocessors. These memories are called "embedded" because they are not directly accessible from the input and output pins of the integrated circuit chip. Instead, an embedded memory is separated by logic blocks from the input and output pins in ordinary operation of the circuit. Testing of these embedded memories is therefore complicated because any access to these memories during normal operation of the chip is mediated by the associated logic.

Integrated circuits are widely used because they offer a high functionality per unit of cost. To achieve the economies necessary in modern integrated circuit manufacturing, it is necessary to minimize both the cost of the raw circuit as well as the cost of testing it. In many cases, the cost of testing the device is comparable to the cost of manufacturing the raw die in the fabrication plant. The cost of a functional die is roughly proportional to the inverse exponential of the die area. Therefore, it is necessary to minimize the die area in order to minimize die costs. The cost of testing is approximately proportional to the product of the test time and the cost of the testing equipment. Therefore, it is desirable to minimize both the test time and the complexity of the test equipment to minimize testing costs.

Testing of memories is generally accomplished by applying test vectors to the memory and reading back the results to ensure proper memory operation. However, testing an embedded memory through the surrounding logic may require a number of test vectors larger than the available memory available in the automatic test equipment used for testing the device and is, in any case, very time-consuming. It is additionally undesirable because the development of programs to execute such tests requires a large amount of skilled test engineering time, which adds to the overhead costs.

Another possible approach to testing embedded memories is to connect the control, address, and data lines of the memories to external pads of the integrated circuit. Multiplexer blocks are implemented within the integrated circuit to connect the embedded memories either to the external pads for testing or to internal buses for standard circuit operation. A drawback to this approach is that the extra bus lines and pads increase the size of the semiconductor die and the extra pads increase the number of pins required of the tester. The cost of the tester is generally roughly proportional to the number of pins. Since the trend is toward wide memories of increasingly large capacity in modern ICs, the number of extra buses and pads required can frequently exceed one-hundred, which represents a prohibitive cost burden.

To avoid excessive costs while simultaneously providing adequate fault coverage, there has been a movement toward built-in self test (BIST) of integrated circuits. This approach relies on circuitry built into the integrated circuit to test the memories and report the results to off-chip electronics by means of a restricted number of pins. An example of BIST methodology are the commonly-used Joint Test Action Group (JTAG) standards. Special test modes which disable the normal operation of the circuit are invoked to enable BIST.

BIST attempts to provide complete fault coverage while minimizing test time and the area of the die that is occupied by the BIST circuitry. In some applications, it is also desirable that diagnostic information be available for faults that are detected. These requirements are in conflict because adding diagnostic capability adds size to the BIST. Various schemes have been developed which optimize one factor at the expense of the others.

One method for reducing the area on the chip devoted to data buses is to use a serial data-in line and a serial data-out line. Buffers are loaded serially and then used for parallel operation during writing, reading and comparison of the results read from the memory with the stored data. A disadvantage to this approach is that the maximum operational frequency is reduced by the width of the data word (e.g. 32 bits), so that the memory is tested at much less than operational frequency. Thus, faults that appear only at normal speed operation, such as capacitive coupling faults and transition faults, are not detected. Another consequence is that the time needed to test the memory is increased by the time necessary to load the buffers serially. This can increase the test time by a factor approximately equal to the width of the memory words.

Another approach is to add multiplexers to the memory input/output lines such that the data read from the memory can be loaded back into adjacent bits during the subsequent write while the memory is in the test mode. Thus, the data from bit 1 is available for writing into bit 2; the data from bit 2 is available for writing into bit 3; etc. The first bit receives new data and the data output from the last bit is routed back to the finite state machine BIST controller for comparison. In operational mode, the multiplexers connect the memory data lines to the chip data bus. Because data is always available for writing when a read operation is completed, the memory may be tested at operational speeds, which increases the quality and accuracy of the test procedure.

Several ways of implementing this scheme are possible. In one possible implementation, the output of the last bit of a word in the first memory is fed into the input of the first bit of a word in the second memory, etc. so as to make all of the memories into effectively one very wide memory for testing purposes. Another implementation involves adding a series of control lines so that each memory can be enabled separately. This allows each memory to be tested sequentially. In the case that the embedded memories are of differing depths, the second method must be used because the first method requires that the memory depths be the same.

There are certain drawbacks to these approaches. For example, although the above implementation offers the advantage of small area utilization, it is nonetheless relatively slow. Furthermore, in the case of a failure, all that is known is the word address of the failure. Information as to which bit failed is not available because the word is structured to operate as a serial shift register with no internal observability. Indeed, in the case that the first proposed method of chaining words in parallel is used, not even the memory that failed can be ascertained. For simple pass or fail testing, it is sufficient to identify that a failure has occurred. However, if redundancy is to be used to repair the failure or if the cause of the failure is to be analyzed, critical information is not available. In fact, if the word were to contain an even number of transition or capacitive coupling faults which cause the bit to read the opposite of the intended data, even the presence of the faults is masked.

An alternate approach is to generate data patterns and address sequences centrally and route them to the embedded memories. This approach is faster than the above serial test approach, especially if several embedded memories are tested in parallel. A drawback to this approach is that routing the extra data and address buses consumes significant amounts of area on the chip as the data path width increases from the historical size of 8 bits to 32 or 64 bits, which are increasingly common. It may not be possible to use the same buses for testing and normal operation because the testing signals should be routed in parallel to the embedded memories while the buses in operation are often separate, e.g. the case of data and instruction caches. This means that testing requires extra buses plus a multiplexer per data and address line.

It has been proposed to reduce the busing area by using a separate pattern generator for each array to be tested and routing only a simple coded instruction from the controller to the pattern generator to instruct the pattern generator which of a set of canned tests stored in the pattern generator to execute. This approach saves on routing area at the expense of the area necessary to create individual pattern generators to test a plurality of memories.

While parallel testing of embedded memories is desirable from a speed standpoint, different embedded memories (e.g. data cache RAM and the associated tag cache RAM) in an integrated circuit are often not of the same size. If two memories of different sizes are tested by being written with the same data pattern, the data in the smaller memory will be overwritten starting with the lower order address space with the data intended to fill the remaining space in the larger memory if the process of writing to the smaller memory is not inhibited when its address space is exceeded. This situation could easily result in incorrect test results for the smaller memory.

One approach that has been proposed to solve this problem is to use the state of the higher order addresses to inhibit the write signal to the smaller memory, which can be efficient in a few special cases. For example, if one memory is smaller in the row direction and the size of the row address space of the smaller memory is a binary multiple (e.g. $2^k$) of the larger array, OR'ing the higher order row addresses that are unused in the smaller memory provides a simple means of generating the needed inhibit signal. However, for the more general case that the smaller array is of an arbitrary size that is not a binary multiple of the larger array, a magnitude comparator is required which becomes prohibitively complex for larger address spaces and consequently consumes an unacceptably large chip area.

In some types of memory there are important differences between row and column addresses. For example, DRAMs sense a complete row at once. Therefore it is common that the access time for address transitions among the column addresses within the same row are much faster than the access time for address transitions that involve selection of differing rows. Similarly, certain types of nonvolatile memories have the capability to write to a page at a time wherein the page lies along the same row. Because of this capability, the write timings for transitions along a row may be quite different than those for transitions from one row to another.

Despite the differences that may occur in row and column timings, it has been common practice in memory BIST to treat the address space as an undifferentiated whole with no distinction made between row and column addresses. Thus a single counter is used for the address generation for the cases in which the addresses are generated locally. This may be because of the implicit assumption that the embedded memories are SRAMs which are often designed to exhibit little difference between row and column address transitions in both the read and write modes. Although SRAMs are probably the most common type of embedded memory, use of nonvolatile memories and DRAMs as embedded memory is becoming more common.

Therefore, a need exists for a technique that allows the row and column addresses to be varied in a controlled manner so that, for example, the entire column address space could be accessed each time there was a transition in the row address space. Moreover, because all of the embedded memories may not have the same organization of rows and columns, a need exists for the technique to allow each embedded memory on an integrated circuit to be tested according to a different pattern of row and column addresses if necessary.

SUMMARY OF THE INVENTION

The present invention provides a method and apparatus for independently controlling the row and column addressing of a semiconductor memory by a BIST circuit. The present invention also allows use of different patterns of rows and columns during test to accommodate memories having address spaces of different sizes or configurations.

In one embodiment of the present invention, a semiconductor device includes a memory having a matrix of addresses and a BIST circuit for use in testing the memory, the BIST circuit including an input circuit that is coupled to the memory and that is capable of independently selecting a row address or a column address of the memory and providing test signals to the selected row or column.

In another embodiment, the present invention provides a method of testing a semiconductor device using a BIST circuit, the device including plural memories each having a matrix of addresses, the method including selecting a first address in a first memory by independently selecting a first row and a first column of the first address, selecting a second address in a second memory by independently selecting a second row and a second column of the second address, and applying test signals to the two addresses.

These embodiments provide flexibility in selecting addresses to be tested, improved transition time between rows, and an ability to determine which memory address passes or fails the test.

The present invention also provides for preventing overwriting of data sent to a memory address when multiple memories are tested contemporaneously and one memory has a smaller address space than another. For example, to prevent overwriting, the present invention may inhibit further application of test signals to a memory that has had test signals applied to all of its addresses, or it may continue to apply the last signal to the last address selected. By preventing undesired overwriting, the invention provides for improved diagnosis.

The present invention also provides that when plural memories are tested contemporaneously, the test signals may be delayed in order to apply the signals to the memories substantially simultaneously. This allows for improved testing of memories that are disposed at different distances away from the BIST circuit.

A further understanding of the nature and advantages of the invention herein may be realized by reference to the remaining portions of the specification and the attached drawings.

DETAILED DESCRIPTION OF PREFERRED EMBODIMENTS

Figure 1:
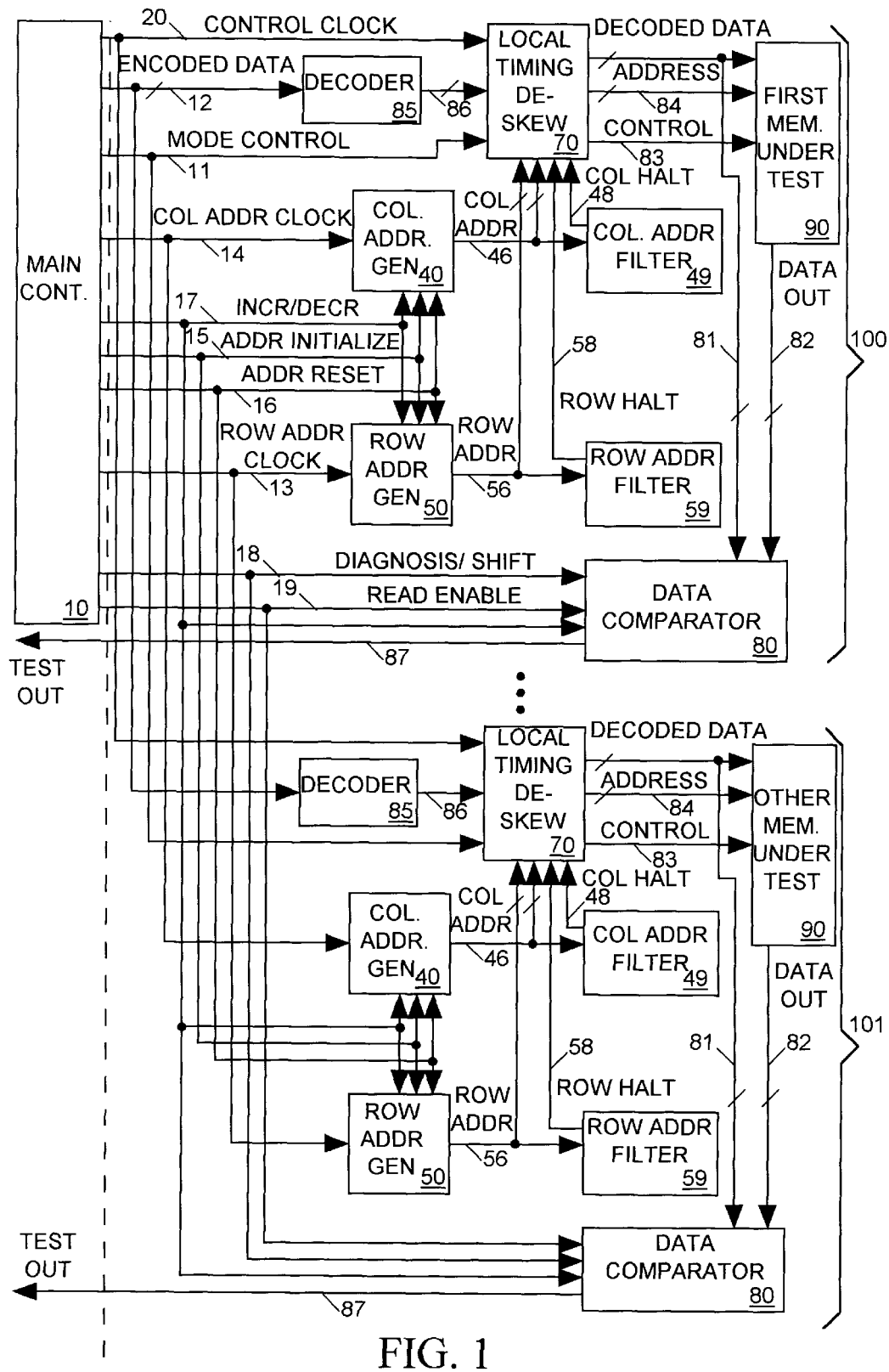
FIG. 1 is a block diagram of an entire BIST circuit and routing connections of a BIST function designed in accordance with the teachings of this invention.

FIG. 1 shows an overall block diagram of a preferred embodiment of a BIST circuit according to the present invention. The circuitry for a BIST function such as the one shown in FIG. I can be generated by a logic synthesizer that receives input data in a high-level design language describing the function to be performed. In FIG. 1, those lines that are actually buses are indicated by having a diagonal line across them, e.g., line 86 between a decoder 85 and a local timing de-skewing circuit 70. A main controller 10 is shown to the left of the dashed line in the figure. Blocks that appear to the right of the dashed line in this figure are distributed, one group per embedded memory to be tested (e.g., memories 90 and 91). Two such groups of logic functions are shown in FIG. 1 as 100 and 101. Blocks that are distributed for the BIST function are row and column address generators 40 and 50, address filters 49 and 59, the data decoder 85, a data comparator 80, and the local timing de-skewing circuit 70. Note that only one of the lines running from the main controller to the distributed blocks is a bus, encoded data line 12. Even for this bus, the number of lines in the bus can be shown to be less than or equal to $\log_2$(number of patterns) for an encoding circuit that properly minimizes the width of the encoded data bus, as shown in a related application Ser. No. 08/697,969 entitled "Method and Apparatus for Built-In Self Test of Integrated Circuits," which is now abandoned, also assigned to the assignee of the present application and incorporated by reference herein in its entirety for all purposes. The small number of lines required to be routed is an example of efficiency of this invention. This implementation requires only one more line than an implementation that does not distinguish between row and column addresses.

Figure 2:
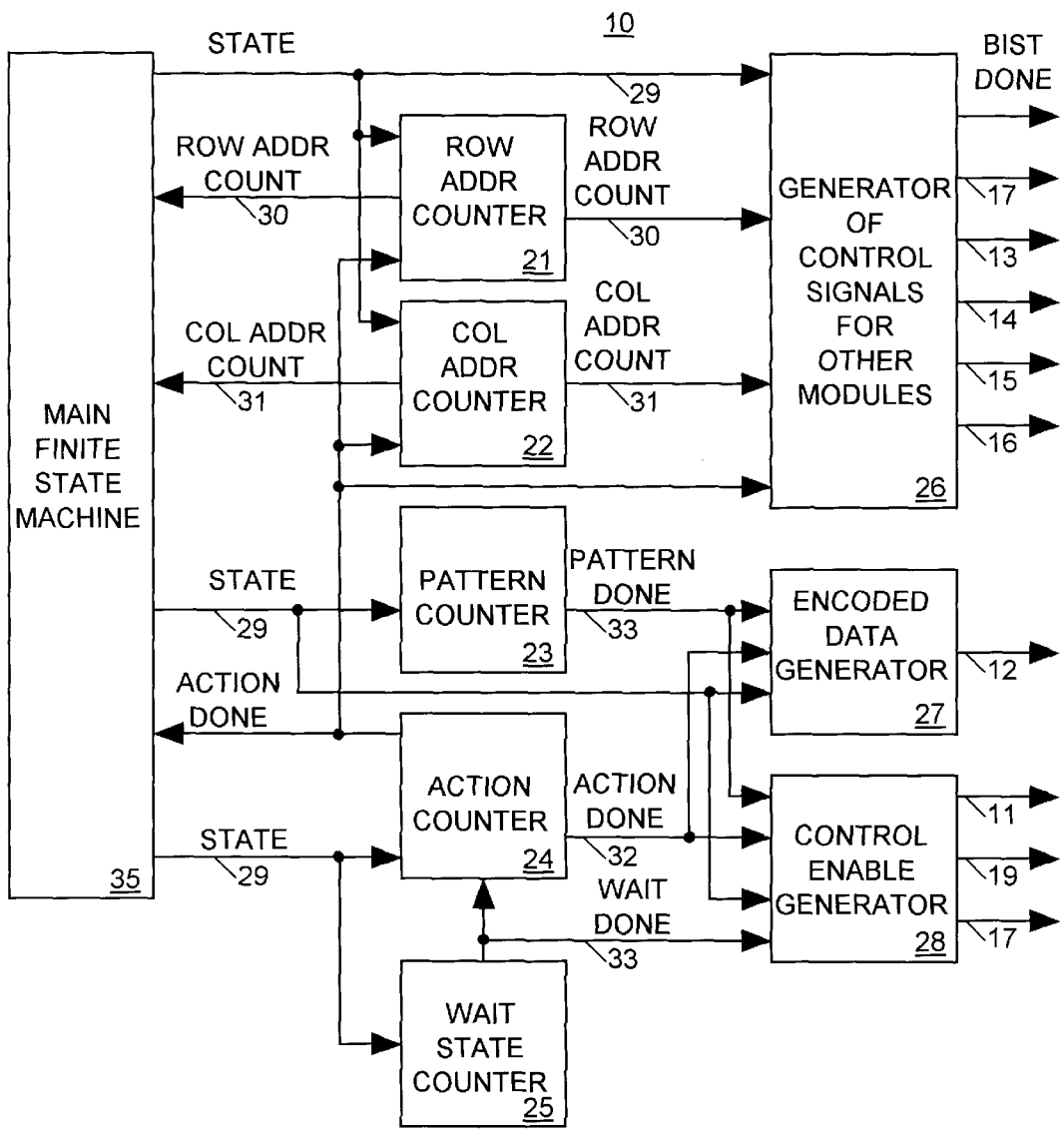
FIG. 2 is a block diagram of a main controller in accordance with the teachings of this invention.

The main controller, shown in FIG. 2, coordinates and synchronizes the tests that are conducted on the individual memories. Row and column address clocks 13 and 14, address initialization signal 15, address reset signal 16, and increment/decrement signal 17 control generation of the addresses for the memory. Although this controller requires two address counters rather than the single counter required for the undifferentiated case, the counters are smaller. The number of bits in the two counters combined, in most cases, equals the number of bits in the single counter used in the undifferentiated case. Therefore, the total chip area used by the counters in the present invention is similar to the chip area of the single counter in the undifferentiated approach.

Referring again to FIG. 1, the decoder 85 decodes the pattern information and provides data to the memory under test. This data is decoded and asserted onto the data bus 86. This signal and the addresses are synchronized by the local timing de-skewing circuit 70. The signals on the data bus 81, address bus 84 and control line 83 exercise the memory by writing to and reading from all of the memory locations in both data states with differing address sequences.

The data comparator 80 compares the data read out of the memory with the corresponding input data and reports the results, pass/fail, under the control of a read enable bus 19 and a diagnosis/shift signal 18. Should the information be deemed valuable, the addition of two more lines allows the data comparator to report the address location of any failing bits back to the controller. This information can be combined with information as to what pattern and data polarity were used and reported to an external tester for further analysis, redundancy repair or other actions.

Figure 3:
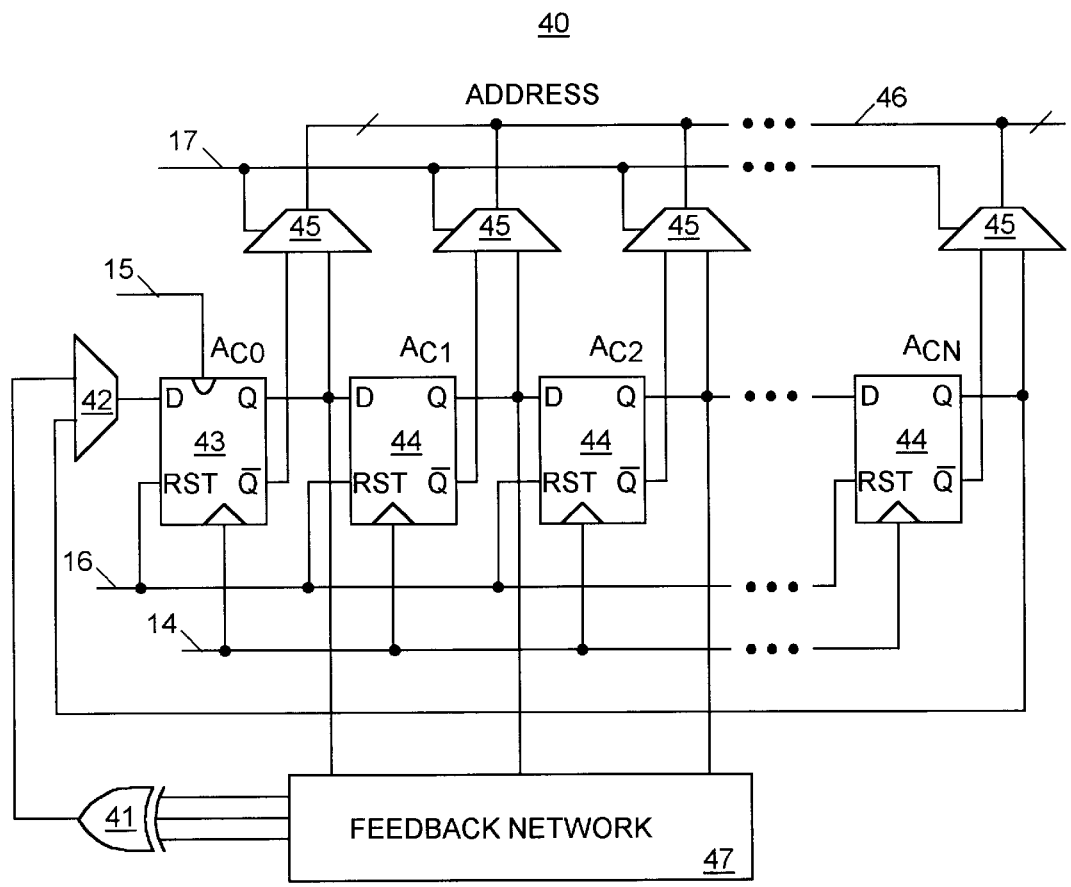
FIG. 3 is a logic diagram of a local address generator designed in conformance with the teachings of this invention.

FIG. 3 shows a logic diagram of a preferred embodiment of a pseudo-random column address generator 40. The pseudo-random column address generator is based on a synchronous shift register with linear feedback. The feedback is determined by a primitive polynomial, and the polynomial order is dependent upon the number of addresses to be generated. The polynomials are well-known in the field and are shown, for example, in the book "Built-in Test for VLSI: Pseudo-random Techniques" by Bardell et al., which is hereby incorporated by reference in its entirety for all purposes. In operation, address reset signal 16 first resets all the outputs of all flip-flops in the register to "0". An address of zero (all 0's) is thus output on address bus 46, which is not otherwise generated by a pseudo-random generator, other than at reset. Next, the address generator 40 is seeded by using address initialization signal 15 to set the $A_{C0}$ flip-flop 43 to "1". The $A_{C0}$ flip-flop 43 is chosen for seeding merely by way of example; any of the other flip-flops could have been chosen for seeding the generator, as appropriate. Clocking the shift register with the address clock 14 will generate all non-zero addresses exactly once in a pseudo-random order on address bus 46, after which the generation is repeated in the same order, if not interrupted.

Multiplexers 45 are used to determine whether the addresses will be sequenced in incrementing order (i.e., start with "all 0's") or decrementing order (i.e., start with "all 1's") by selecting either the data or complement data output from the flip-flops 43 and 44 with the increment/decrement signal 17. A feedback network 47 is connected at the appropriate outputs of the flip-flops 43 and 44 to form the desired primitive polynomial. This polynomial feedback loop through an exclusive-OR (XOR) gate 41 permits generation of the pseudo-random sequence of "0's" and "1's" that is shifted through the shift register. The outputs of multiplexers 45 form the lines of the address bus 46.

In this function, as in the main controller, the number of latches in the counter is dependent upon the number of addresses to be generated and not whether they are partitioned into row and column addresses. Thus, the chip area devoted to address generation is not significantly affected by having separate row and column address generators.

A difficulty that may arise when different types of memories, e.g., nonvolatile memory and SRAM, are integrated on the same integrated circuit is that the different memories will have different sized address spaces. Writing to the whole of the larger address spaces can cause data corruption in the memories with smaller address spaces because a plurality of addresses are aliased into the same address.

This invention can inhibit writing to aliased addresses on memories with smaller address spaces. One method of doing this operates by maintaining the address signals and data signals at a previous valid value when the address bounds are exceeded at the signals of the last valid address. These signals are maintained until another valid address (i.e., an address within the address space of the memory) is asserted. This means that as the address generator provides addresses outside the smaller memory's address space, the last valid address location is written to and read from with the data appropriate to that location while other data may be written to and read from other address locations in the larger memory.

The address filters 49 and 59 in FIG. 1 generate signals to indicate when the bounds of either the row or column address space of the memory are exceeded. This function is only needed for those memories on the IC that have address spaces smaller than other memories that are to be tested at the same time. Thus, this block may be omitted from the logic groups associated with those memories with address spaces equal to that of the largest memory on the chip to be tested. Also, when a pseudo-random approach to the address generation is employed, the addresses may alternate in and out of the allowed address space for the smaller memories a number of times. The present invention can effectively compensate for this situation by maintaining the test signal and row and column address of a previously selected valid memory cell (i.e. a memory cell having an address within the address space of the memory under test) with latches 72, 73 and 74, depicted in FIG. 4, until row and column address for a subsequent valid memory cell are generated.

Address filter 59 may be generated, for example, by the method described in related application Ser. No. 08/697,968, now U.S. Pat. No. 5,930,814, entitled "Efficient Filtering of Differing Address Spaces in Built-in Self Test for Embedded Memories," also assigned to the assignee of the present application and incorporated by reference herein in its entirety for all purposes. Partitioning the address space may simplify the filtering problem and save layout area.

Local timing de-skewing circuit 70 provides pulse shaping and edge placement for the input signals to each embedded memory array 90 and 91. The signals on address bus 84, control line 83 and decoded data bus 81 exercise embedded memories 90 and 91 by writing and reading from all of the memory locations in both polarities with differing address sequences. The de-skewing circuit 70 assures that there are no timing problems associated with accessing different embedded memory arrays 90 or 91 that may be separated by distances that might create timing problems, such as a centimeter or more.

Also, it is possible to prevent aliasing by using the results of the address filtering function to control the read/write signal. Approaches include using the outputs of the address counters in the main controller to generate a signal for the interruption of the write function in the smaller address spaces as is described in a related application Ser. No. 08/707,062, entitled "Efficient Built-In Self Test For Embedded Memories With Differing Address Spaces," also assigned to the assignee of the present application and incorporated by reference herein in its entirety for all purposes.

Figure 4:
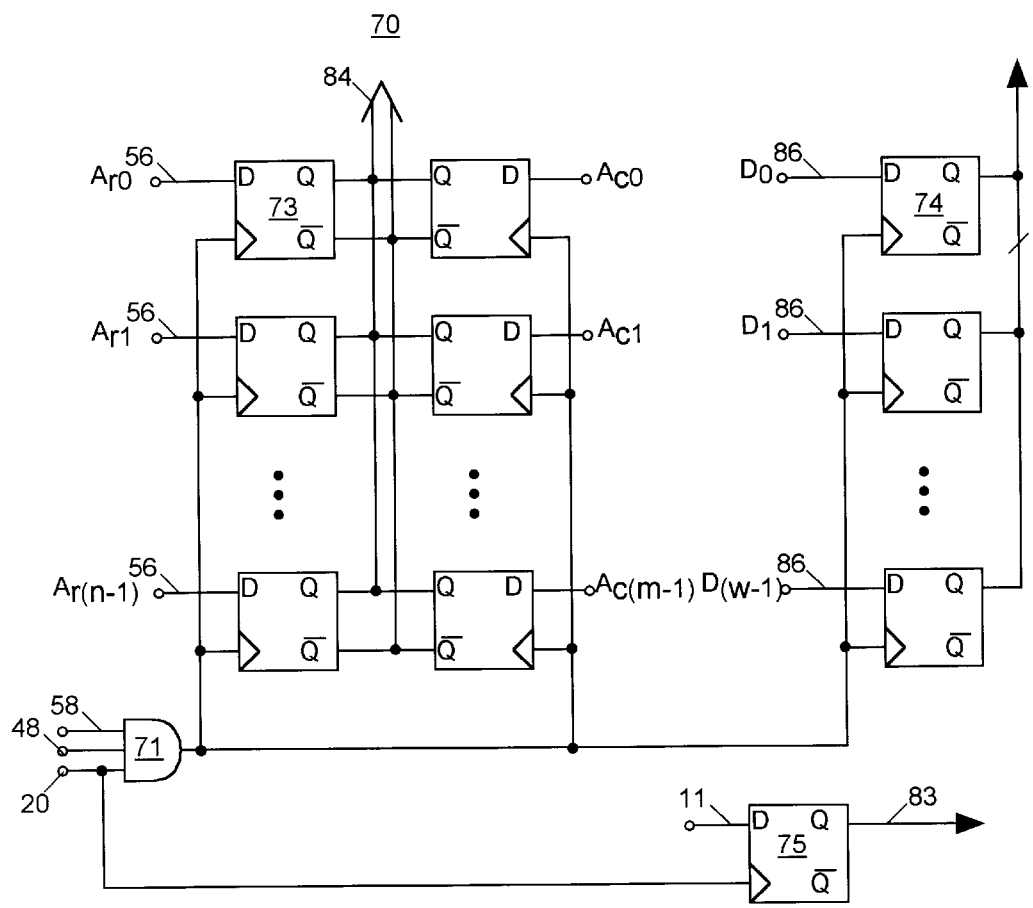
FIG. 4 is a logic diagram of an example of a local timing de-skewing circuit designed in accordance with the teachings of this invention.

FIG. 4 shows a simplified circuit diagram of the local timing de-skewing circuit 70. The de-skewing circuit 70 employs synchronously clocked latches 72 and 73 to provide the de-skewing function, as is common practice in VLSI design. An additional logic element, AND gate 71, inhibits the writing of test data to invalid address locations. As long as address halt signals 48 and 58 are high, the output of the AND gate 71, which is essentially clock signal 20, continues to propagate control signal 83, address signals 84 and data signals 81 through to the embedded memory under test. However, when either address halt signal 48 or 58 goes low, signifying an address out of bounds of the address space of a smaller embedded memory 91, the output of AND gate 71 is always low, freezing the outputs of latches 72, 73 and 74 coupled to the data and address lines, respectively. Only control signal 83 is allowed to propagate through latch 75. Thus, reading and writing is restricted to the previous valid address before the address space of the smaller memory was exceeded, and the data is therefore rewritten over and over again to the location of the previous valid address. The number of gates in this circuit is not dependent upon the address segmentation.

FIG. 2 illustrates that this embodiment employs separate counters 21 and 22 for the row and column addresses, respectively. In the main controller, the two counters are controlled by the state signal 29. Either one, the other, or both may be running at one time depending on whether a fast row, a fast column, or a random addressing sequence in desired. The output of the two counters in the main controller determine the operation of the row and column address clocks 13 and 14, respectively.

The above description is illustrative and not restrictive. Many variations of the invention will become apparent to those of skill in the art upon review of this disclosure. For example, many address spaces and other data patterns may be used, which would result in different logic equations and logic diagrams. Moreover, the same logic functions may be realized in a number of ways. The scope of the invention should, therefore, be determined not with reference to the above description, but instead with reference to the appended claims along with their full scope of equivalents.

What is claimed is:

1. A semiconductor device comprising:
    a memory (90) comprising a plurality of memory cells, each memory cell being selected by a unique combination of row and column addresses supplied to said memory, each memory cell receiving and storing data written thereto and then reading out the stored data when said memory cell is selected;

means (80) for comparing data written into each memory cell to data read out of said memory cell when selected;

a column address generator (40,49,70) for generating and supplying a column address sequence to said memory in response to successive pulses of an input column address clock signal (14);

a row address generator (50,59,70) for generating and supplying a row address sequence to said memory in response to successive pulses of an input row address clock signal (13), such that the column and row address sequences select a sequence of said memory cells; and means (10) for selectively generating said column address clock signal and said row address clock signal one of at the same time and at differing times.

2. The semiconductor device in accordance with claim 1 wherein said column address sequence and said row address sequence are pseudo-random sequences.

3. The semiconductor device in accordance with claim 1 wherein said memory has an address space spanning a range of column addresses, and wherein said column address generator (40,49,70) for generating and supplying a column address sequence to said memory comprises:

means (40) for generating a first column address sequence (46) in response to successive pulses of said input column address clock signal (14), wherein said first column address sequence includes column addresses within said range of column addresses and column addresses outside said range of column addresses; and means (49,70) for receiving said first column address sequence, and for replacing column addresses of said first column address sequence that are outside said range of column addresses with column addresses that are within said range of column addresses, thereby to generate said column address sequence supplied to said memory.

4. The semiconductor device in accordance with claim 3 wherein said address space also spans a range of row addresses, and wherein said row address generator (50,59,70) for generating and supplying a row address sequence to said memory comprises:

means (50) for generating a first row address sequence (56) in response to successive pulses of said input row address clock signal (13), wherein said first row address sequence includes row addresses within said range of row addresses and row addresses outside said range of row addresses; and means (59,70) for receiving said first row address sequence, and for replacing row addresses of said first row address sequence that are outside said range of row addresses with row addresses that are within said range of row addresses, thereby to generate said row address sequence supplied to said memory.

5. The semiconductor device in accordance with claim 4 wherein said column address sequence and said row address sequence are pseudo-random sequences.

6. A semiconductor device comprising:

a first memory (90) comprising a plurality of first memory cells, each first memory cell being selected by a unique combination of first row and first column addresses supplied to said first memory, each first memory cell receiving and storing data written thereto and then reading out the stored data when said first memory cell is selected;

a second memory (91) comprising a plurality of second memory cells, each second memory cell being selected by a unique combination of second row and second column addresses supplied to said second memory, each second memory cell receiving and storing data written thereto and then reading out the stored data when said second memory cell is selected;

means (80) for comparing data written into each first memory cell to data read out of said first memory cell when selected;

means (80) for comparing data written into each second memory cell to data read out of said second memory cell when selected;

a first column address generator (40,49,70) for generating and supplying a sequence of first column addresses to said first memory in response to successive pulses of an input column address clock signal (14);

a first row address generator (50,59,70) for generating and supplying a sequence of first row addresses to said first memory in response to successive pulses of an input row address clock signal (13);

a second column address generator for generating and supplying a sequence of second column addresses to said second memory in response to successive pulses of said input column address clock signal (14);

a second row address generator for generating and supplying a sequence of second row addresses to said second memory in response to successive pulses of said input row address clock signal (13); and means (10) for selectively generating said column address clock signal and said row address clock signal one of at the same time and at differing times.

7. The semiconductor device in accordance with claim 6 wherein said sequences of first and second column addresses and said sequences of first and second row addresses are pseudo-random sequences.

8. The semiconductor device in accordance with claim 6, wherein said first memory has an address space spanning a range of column addresses, and wherein said first column address generator (40,49,70) for generating and supplying said sequence of first column addresses to said first memory comprises:

means (40) for generating a first column address sequence (46) in response to successive pulses of said input column address clock signal (14), wherein said first column address sequence includes column addresses within and outside said range of column addresses; and means (49,70) for receiving said first column address sequence, and for replacing column addresses of said first column address sequence outside said range of column addresses with column addresses within said range of column addresses, thereby to generate said sequence of first column addresses supplied to said first memory.

9. The semiconductor device in accordance with claim 8 wherein said address space also spans a range of row addresses, and wherein said first row address generator (50,59,70) for generating and supplying a sequence of first row addresses to said first memory comprises:

means (50) for generating a first row address sequence (56) in response to successive pulses of said input row address clock signal (13), wherein said first row address sequence includes row addresses within and outside said range of row addresses; and means (59,70) for receiving said first row address sequence, and for replacing row addresses of said first row address sequence outside said range of row addresses with row addresses within said range of row addresses, thereby to generate said sequence of first row addresses supplied to said first memory.

10. The semiconductor device in accordance with claim 9 wherein said sequences of first and second column addresses and said sequences of first and second row addresses are pseudo-random sequences.

* * * * *